(12) United States Patent
Yoon et al.

(10) Patent No.: US 7,295,489 B2
(45) Date of Patent: Nov. 13, 2007

(54) METHOD AND CIRCUIT FOR WRITING DOUBLE DATA RATE (DDR) SAMPLED DATA IN A MEMORY DEVICE

(75) Inventors: Yong-Jin Yoon, Seoul (KR); Jong-Cheol Lee, Sungnam-si (KR); Uk-Rae Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 360 days.

(21) Appl. No.: 11/037,602

(22) Filed: Jan. 18, 2005

(65) Prior Publication Data

US 2005/0157827 A1   Jul. 21, 2005

(30) Foreign Application Priority Data

Jan. 20, 2004   (KR) .................... 10-2004-0004208

(51) Int. Cl.
  *G11C 7/00* (2006.01)
(52) U.S. Cl. ..................... 365/233; 365/191
(58) Field of Classification Search .............. 365/233, 365/191
  See application file for complete search history.

(56) References Cited

U.S. PATENT DOCUMENTS

| | | | |
|---|---|---|---|
| 5,577,236 A | 11/1996 | Johnson et al. ............ 395/551 |
| 6,232,811 B1 | 5/2001 | Ihm ............................. 327/262 |
| 6,538,483 B2 | 3/2003 | Natsume ...................... 327/144 |
| 6,570,791 B2 | 5/2003 | Roohparvar et al. ... 365/185.33 |
| 6,570,944 B2 | 5/2003 | Best et al. ................... 375/355 |
| 6,584,037 B2 | 6/2003 | Farmwald et al. .......... 365/233 |
| 6,675,272 B2 * | 1/2004 | Ware et al. ................. 711/167 |
| 6,807,125 B2 * | 10/2004 | Coteus et al. ............... 365/233 |
| 6,873,928 B2 * | 3/2005 | Thurman et al. ........... 702/127 |
| 2005/0189971 A1 * | 9/2005 | Kizer et al. ................. 327/147 |

* cited by examiner

*Primary Examiner*—Michael T Tran
(74) *Attorney, Agent, or Firm*—F. Chau & Associates, LLC

(57) ABSTRACT

A method and circuit for sampling and writing data in a double data rate (DDR) memory device, capable of securing sufficient setup and hold margins regardless of the operation frequency. Transferring first and second sampled input data to a first path using a first path control signal. Transferring third and fourth sampled input data to a second path using a second path control signal. The first and second path control signals are one half-cycle out of phase. First to fourth data are successively sampled in synchronization with a rising or falling edge of a first external clock signal; The sampled first data is linked onto a first path and the sampled second data is linked onto a second path in response to the first path control signal (generated in synchronization with a falling edge of the external clock signal); the first data on the first path and the second data on the second path are written to the memory cells in response to a write clock signal.

31 Claims, 7 Drawing Sheets

METHOD AND CIRCUIT FOR WRITING DOUBLE DATA RATE (DDR) SAMPLED DATA IN A MEMORY DEVICE

CROSS-REFERENCE TO RELATED APPLICATION

This application claims the benefit of Korean Patent Application No. 2004-4208, filed on Jan. 20, 2004, the disclosure of which is hereby incorporated herein by reference in its entirety.

BACKGROUND

1. Technical Field

The present invention relates to memory devices, and more specifically, to a method and circuit for writing sampled input data to memory cells in a semiconductor memory device having a double data rate (DDR) scheme.

2. Discussion of the Related Art

As the demand for higher speed semiconductor devices increases, a double data rate data sampling scheme (hereinafter, referred to as "DDR") that is capable of inputting (writing) or outputting (reading) data at a rising edge as well as a falling edge of an external clock signal, is being increasingly employed. Data is sampled to allow two data to be read or written during one external clock cycle. Thus, Double Data Rate (DDR) is achieved by using both the rising and falling edges of the clock to transfer data.

In the case of a DDR semiconductor memory device, for example, a DDR static random access memory (DDR SRAM) device, data is inputted/outputted in a burst mode in synchronization with each of rising and falling edges of the external clock signal. In a write operation of the SRAM device, data inputted (written) in response to a write command signal, for example, input data is stored in a temporary register in response to a second write command signal, and the stored data is written to memory cells of the device in response to a third write command signal. Generally, the DDR SRAM device uses a clock centered (CC) mode in which, when data is written to the device, four data are successively inputted (written) to the device in synchronization with an external clock signal in a next cycle after a write command signal is inputted to the device, data is inputted at a center of the external clock signal in synchronization with the rising edge or falling edge of the external clock signal, and a sampling clock signal is generated at the rising edge or the falling edge of the external clock signal. Also, in a clock aligned (CA) mode, data is inputted to the device at the rising or falling edge of the external clock signal in synchronization with the rising edge or the falling edge of the external clock signal and a sampling clock signal is generated at the center of the external clock signal.

A conventional method and device for sampling data in a semiconductor memory device are disclosed in U.S. Pat. No. 6,538,483 entitled "Method and apparatus for data sampling," and a circuit for controlling setup and hold margins in a semiconductor memory device is disclosed in U.S. Pat. No. 6,232,811 entitled "Circuit for controlling setup/hold time of semiconductor device."

FIG. 1 is a diagram partially showing a circuit of the prior art for explaining a method for sampling data in a DDR SRAM device. FIG. 2 is a timing diagram showing a data sampling operation in a CC mode of the DDR SRAM device of FIG. 1. FIG. 3 is a timing diagram showing a data sampling operation in a CA mode of the DDR SRAM device of FIG. 1.

Hereinafter, a prior art method for sampling and writing data in a DDR SRAM device using a a single path control signal will be described in brief with reference to the accompanying drawings.

Referring to FIG. 1, a prior art path control signal generating circuit 100, used for data sampling, is composed generally of a basic CMOS flip flop comprised essentially of inverters (e.g., in inverting latches 110, 120) and of transmission (pass) gates (102, 104) having an input A0 to be sampled and latched and a having single output (path control signal) PS. A first (inverting) latch 112 latches (and inverts) an address signal A0 input via the transmission (pass) gate 102 controlled by the sampling clock signal CLK and its complement; the first pass gate 102 passes the address signal A0 when during the active level of the sampling clock signal CLK; the first latch 110 stores the address signal A0 output from (passed by) the first pass gate in a latched form and inverts the address signal A0; second and third inverters 114 and 116 continuously buffer the inverted address signal A0 (output from the first latch 110); a second pass gate 104 passes the buffered inverted address signal A0 (output from the third inverter 116) when receiving the active level of the sampling clock signal CLK; a second latch 120 stores the inverted address signal A0 (received via the second pass gate 104) in a latched form and inverts it to output a latched address signal A0 to the fourth inverter 118; the fourth inverter 118 inverts the latched address signal A0 and outputs the path control signal PS. The path control signal generating circuit 100 generates the path control signal PS the value of which depends on logical states of the sampling clock signal CLK and the address signal A0, both of which are generated in synchronization with an external clock signal (see FIGS. 2, 3).

Referring to FIG. 2, in the CC mode of a DDR SRAM device including the conventional path control signal generating circuit 100 of FIG. 1, four of first to fourth data D1_H, D1_L, D2_H and D2_L are successively inputted to the device in synchronization with a rising edge or a falling edge of the external clock signal (ECLK) in response to a write commands. A first sampling clock signal SCLK1 is generated in synchronization with each rising edge (transition) of the external clock signal (ECLK), to enable the first data D1_H to be sampled (and latched) and a path control signal PS having a "0" state is generated in synchronization with an active level of the first sampling clock signal SCLK1, causing the first (sampled) data D1_H to be linked to a first path Path1. Next, a second sampling clock signal SCLK2 is generated (in synchronization with each falling edge (transition) of the external clock signal ECLK), enabling the second data D1_L to be sampled (and latched),) to cause the second data D1_L to be linked to a second path Path2, while the path control signal (PS) having a "0" state is generated (in synchronization with the first sampling clock signal SCLK1). A writing clock signal WCLK is generated in synchronization with selected (e.g., third and fourth) rising edges of the external clock signal, so that the first data D1_H on the first path and the second data D1_L on the second path are written to the memory cells. Subsequently, the first sampling clock signal SCLK1 is generated (in synchronization with a second rising edge of the external clock signal ECLK), enabling the third data D2_H to be sampled, and the path control signal having a "1" state is generated (in synchronization with the first sampling clock signal SCLK1) so that the third data D2_H is linked to the second path Path2, and to cause the second data D1_L to be linked to the first path Path1.

The data to be written to the memory cells is changed from the first data D1_H to the second data D1_L on the first path1 and from the second data D1_L to the third data D2_H on the second path2 at a time point where the write clock signal WCLK is generated, resulting in an insufficient hold margin which may cause an error upon writing data. Conventionally, in order to solve this problem, the data on the first and second paths are delayed (relative to the writing clock WCLK) by a predetermined time and then written.

Referring to FIG. 3, in the CA mode of the DDR SRAM device including the conventional path control signal generating circuit 100 of FIG. 1, four of first to fourth data D1_H, D1_L, D2_H and D2_L are successively inputted to the device in synchronization with the rising edge or the falling edge of the external clock signal and a write command. Subsequently, a first sampling clock signal SCLK1 is generated (at a first center of a Hi external clock signal in synchronization with a first rising edge of the external clock signal), enabling the first data D1_H to be sampled, and a path control signal having a "0" state is generated (in synchronization with the first sampling clock signal SCLK1), so that the first data D1_H is sampled to the first path Path1. Next, a second sampling clock signal SCLK1 is generated (at a center of a Low external clock signal in synchronization with a first falling edge of the external clock signal), enabling the second data D1_L to be sampled, and the path control signal having a "0" state is generated (in synchronization with the first sampling clock signal SCLK1) to cause the second data D1_L to be linked to the second path Path2. A write clock signal WCLK is generated (in synchronization with the second and third rising edges of the external clock signal), so that the first data D1_H on the first path and the second data D1_L on the second path are written to the memory cell.

Subsequently, the first sampling clock signal SCLK1 is again generated (at a center of a Hi external clock signal ECLK in synchronization with a second rising edge of the external clock signal ECLK), enabling the third data D2_H to be sampled, and the path control signal having a "1" state is generated (in synchronization with the first sampling clock signal SCLK1), so that the third data D2_H is linked to the second path Path2 and the second data D1_L is linked to the first path Path1.

As a result, there is a problem that a sufficient setup margin M1 cannot be secured because the second data D1_L on the second path Path2 is positioned at a point of ¼ or less of the external clock cycle period when the write clock signal WCLK I is generated. Thus, there can arise a problem that an error is caused upon writing data because a setup margin in a CA mode is insufficient. The problem is great where the SRAM device has a high operation frequency and data on the first and second paths are delayed and then used to secure the hold margin in the above-stated CC mode.

SUMMARY OF THE INVENTION

Aspects of the invention provide a method and a circuit for sampling data in a semiconductor memory device.

The method and circuit for sampling data in a semiconductor memory device is capable of securing setup and hold margins unimpaired by operation frequency. The method and circuit support sampling the data alternately in conjunction with a first path control signal and a second path control signal, which are clock signals having different timings, in a semiconductor memory device having a double data rate (DDR) data sampling scheme. The double data rate (DDR) means that two data bits are sent and received each clock cycle, i.e., one bit on the rising edge of the clock and one bit on the falling edge.

Another aspect of the present invention to provides a method for sampling data in a semiconductor memory device and a data sampling circuit therefor capable of securing setup and hold margins having duration of at least ¼ cycle or more in all operation modes by generating first and second path control signals for specifying a first or second path for the sampled data, in synchronization with a falling edge of an external clock signal, and enabling a write clock signal WCLK to be positioned at a center or ¼ point of the sampled data to be written. As used herein the term "¼ point of the sampled data" refers to point in time one quarter of the length of the period of availability of the latched data. As used herein, the terms "in synchronization with" includes "simultaneously with" and "subsequently", and "as a consequence of" (indicating a causal relation).

Another aspect of the present invention provides a method for sampling data in a semiconductor memory device and a data sampling circuit therefor capable of maximizing an operation speed of the semiconductor memory device since an internal error generated upon setup and hold can be reduced or minimized by sampling the data with a path control signal synchronized with a falling edge of an external clock signal to secure sufficient setup and hold margins in all operation modes.

According to the present invention, there is provided a method for sampling data in a semiconductor memory device that comprises memory cells for storing the data and uses a data sampling scheme with a DDR mode, the method including steps of: successively inputting first to fourth data in synchronization with a rising or falling edge of a first external clock signal as a write command signal; sampling the first data onto a first path and sampling the second data onto a second path in response to a first path control signal, the first path control being generated in synchronization with a falling edge of a second external clock signal; writing the first data on the first path and the second data on the second path to the memory cells in response to a write clock signal, the write clock signal being generated in synchronization with a rising edge of a third external clock signal; sampling the third data onto the second path and the fourth data onto the first path in response to a second path control signal, the second path control signal being generated in synchronization with a falling edge of the third external clock signal; and writing the fourth data on the first path and the third data on the second path to the memory cell in response to a write clock signal, the write clock signal being generated in synchronization with a rising edge of a fourth external clock signal.

Further, according to the present invention, there is provided a method for sampling data in a semiconductor memory device that comprises memory cells for storing the data and uses a data sampling scheme with a DDR mode, the method including steps of: successively inputting first to fourth data in synchronization with a rising or falling edge of a first external clock signal as a write command signal; generating a first sampling clock signal in synchronization with a rising edge of a second external clock signal to sample the first data; generating a second sampling clock signal in synchronization with a falling edge of the second external clock signal to sample the second data, and generating a first path control signal to sample the first data onto a first path and the second data onto a second path; generating the first sampling clock signal in synchronization with a rising edge of a third external clock signal to sample the third data, and generating a write clock signal to write the first data on the first path and the second data on the second path to the memory cells; generating the second sampling clock signal in synchronization with a falling edge of the third external clock signal to sample the fourth data, and generating a second path control signal to sample the third data onto the second path and the fourth data onto the first path; and generating a write clock signal in synchronization with a rising edge of a fourth external clock signal to write the fourth data on the first path and the third data on the second path to the memory cells.

Further, according to the present invention, there is provided a circuit for sampling data in a semiconductor memory device that comprises memory cells for storing the data and uses a data sampling scheme with a DDR mode, the circuit comprising: a path control signal generating circuit for generating first and second path control signals in response to an address signal and a sampling clock signal, the first and second path control signals being clock signals having different timing; a path control circuit for sampling input data onto a first or second path in response to the first or second path control signal; and a write control circuit for writing the sampled data to the memory cells in response to a write clock signal.

BRIEF DESCRIPTION OF THE DRAWINGS

The above and other features of the present invention will become more apparent to those of ordinary skill in the art by describing in detail preferred embodiments thereof with reference to the attached drawings in which.

DETAILED DESCRIPTION OF THE INVENTION

Preferred embodiments of the present invention will be described in detail with reference to the accompanying drawings. Descriptions in various embodiments are shown and provide examples to those skilled in the art to convey a more thoroughly understanding the present invention, and accordingly should be not construed to limit the scope of the present invention which is defined in the claims.

Figure 1:
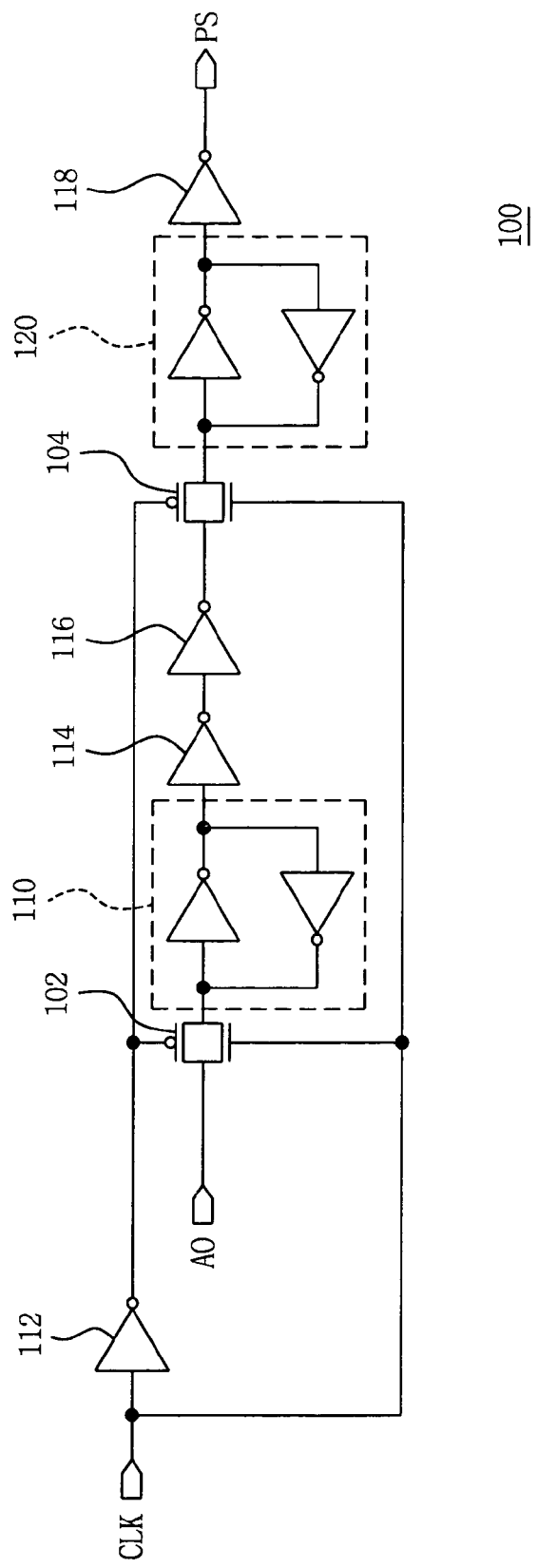
FIG. 1 is a circuit diagram of a conventional path control signal generating circuit for explaining a conventional method for sampling data in a DDR SRAM device.
Figure 2:
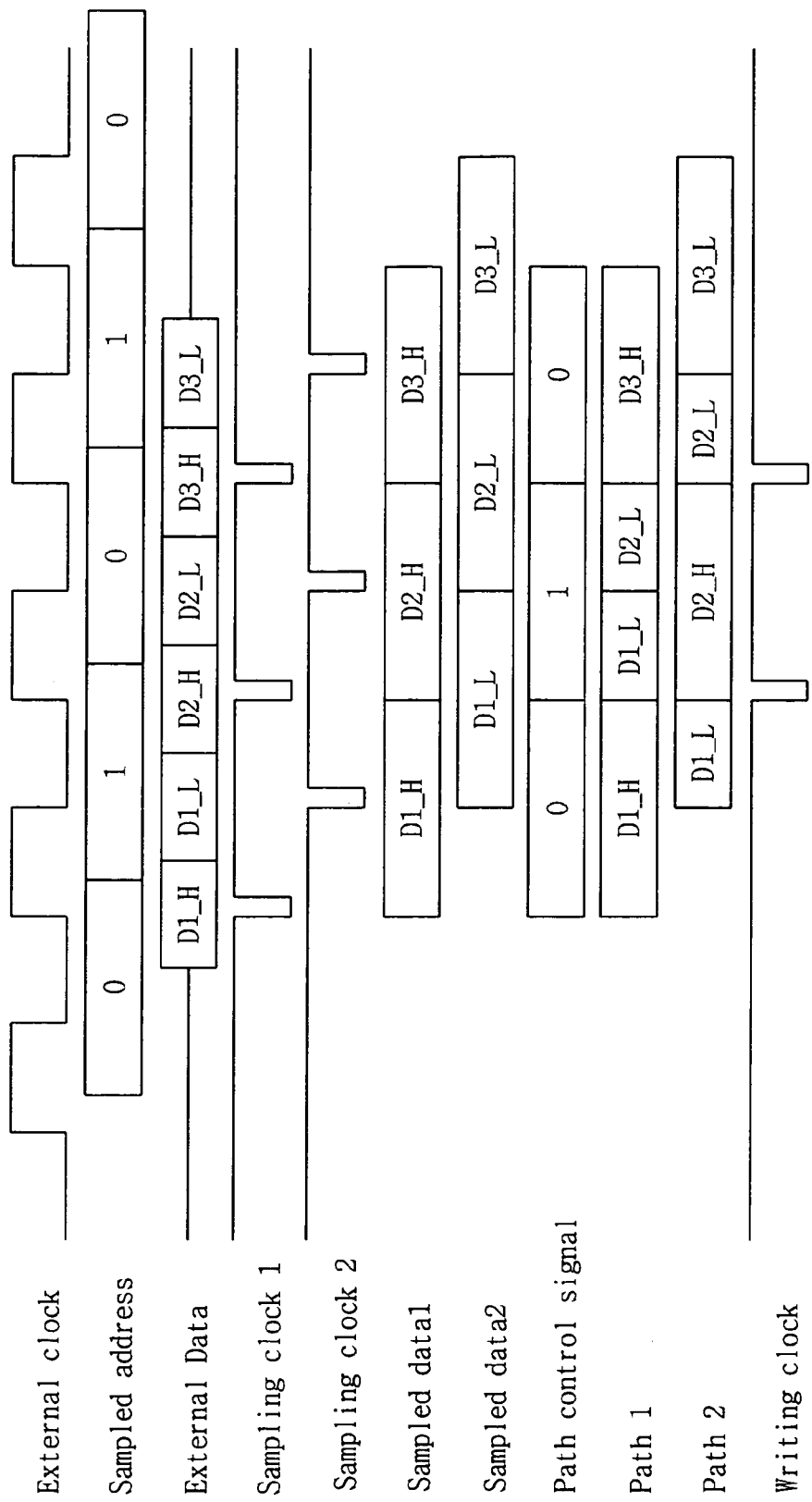
FIG. 2 is a timing diagram showing a data sampling operation in a CC mode of a DDR SRAM device including the conventional path control signal generating circuit of FIG. 1.
Figure 3:
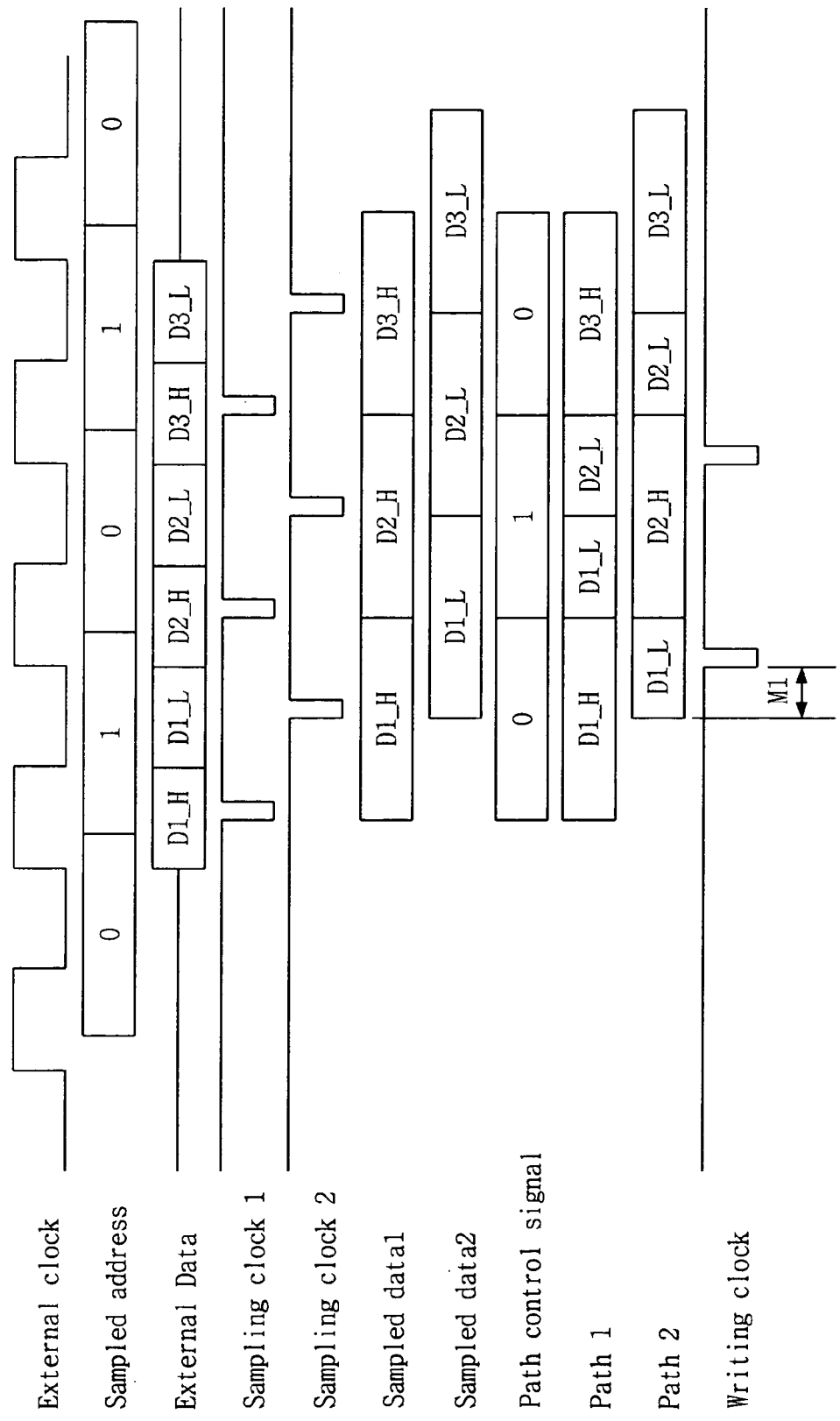
FIG. 3 is a timing diagram showing a data sampling operation in a CA mode of a DDR SRAM device including the conventional path control signal generating circuit of FIG. 1.
Figure 4:
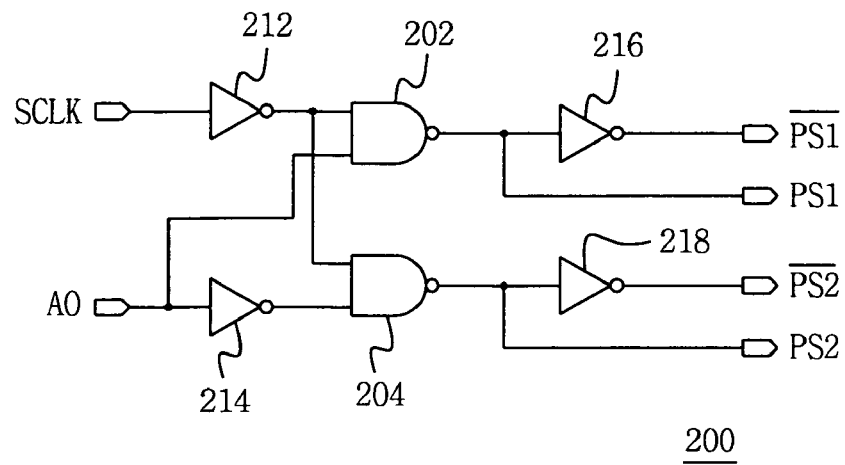
FIGS. 4, 5 and 6 are circuit diagrams showing a data sampling circuit in a DDR SRAM device according to an embodiment of the present invention.
Figure 5:
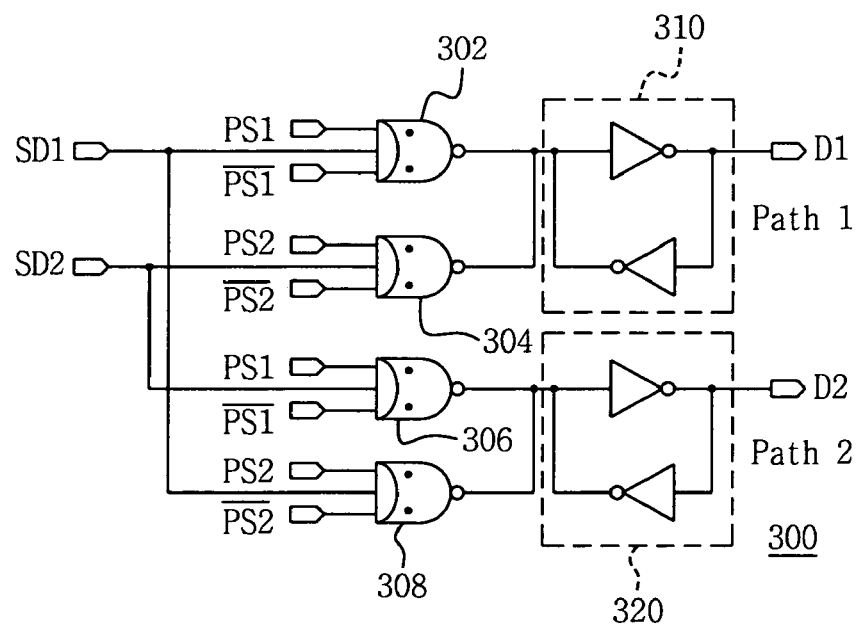
Figure 6:
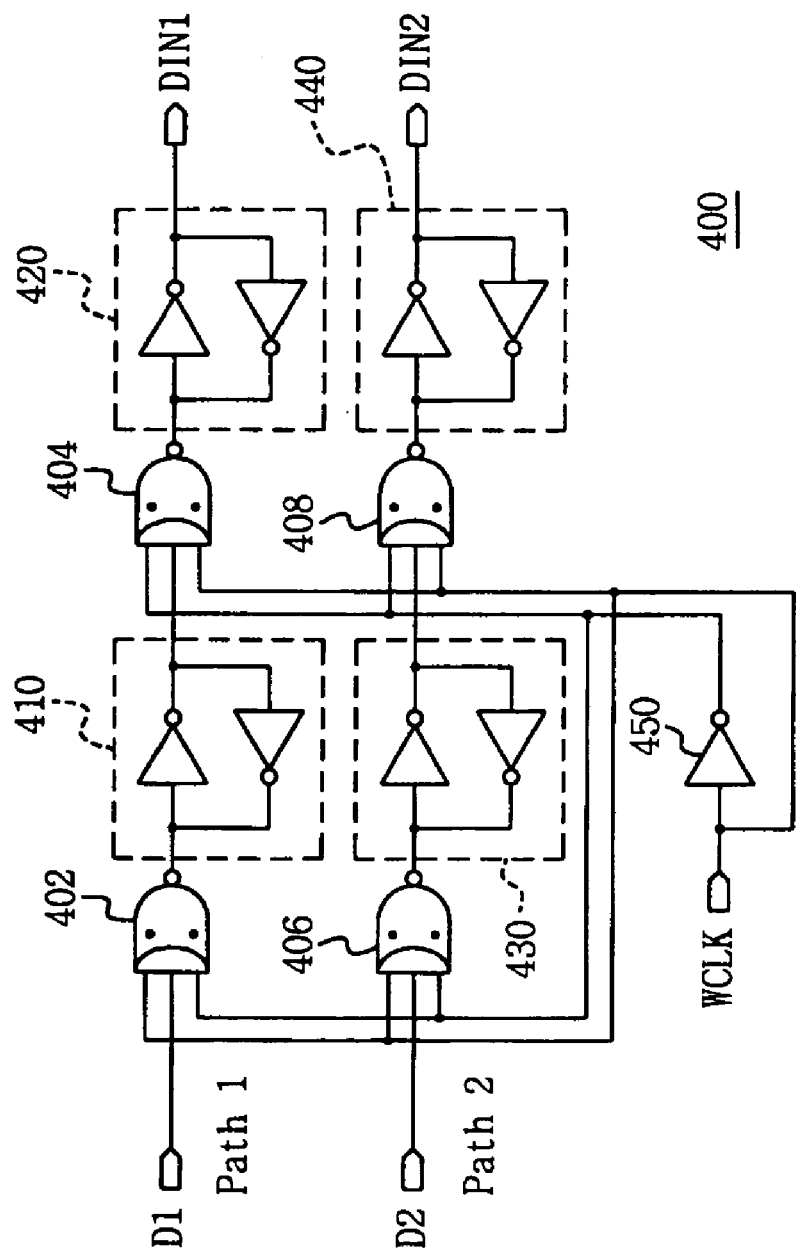

FIGS. 4, 5 and 6 are circuit diagrams showing a data sampling circuit in a DDR SRAM device according to an embodiment of the present invention. The circuit will be described specifically with reference to FIGS. 4, 5 and 6.

Referring to FIGS. 4, 5 and 6, a data sampling circuit according to an embodiment of the present invention includes a path control signal generating circuit 200 (FIG. 4), a path control circuit 300 (FIG. 5), and a write control circuit 400 (FIG. 6). As shown in FIG. 4, the path control signal generating circuit 200 includes: a first inverter 212 for inverting an applied sampling clock signal SCLK; a first NAND gate 202 for receiving the inverted sampling clock signal/SCLK and an address signal A0 as inputs; a second inverter 216 for inverting an output PS1 from the first NAND gate 202 to generate inverted signal/PS1; a third inverter 214 for inverting the address signal A0; a second NAND gate 204 for receiving the inverted signal/SCLK (derived from the sampling clock signal SCLK) and the inverted address signal/A0 (derived from the address signal A0) as inputs; and a fourth inverter 218 for inverting an output PS2 from the second NAND gate to generate inverted signal/PS2. The path control signal generating circuit 200 generates path control signals PS1 and PS2 depending on logical states of the sampling clock signal SCLK and the address signal A0, both of which are generated in synchronization with an external clock signal. For example, if the address signal A0 in a "1" state is inputted and the sampling clock signal SCLK is transitioned from an "1" state to a "0" state, the address signal A0 and the inverted signal/SCLK of the sampling clock signal are inputted to the first NAND gate 202, such that the first path control signal PS1 is generated in the "0" state at the output of the first NAND gate 202; and the inverted signal/A0 (derived from the address signal A0) and the inverted signal/SCLK (derived from the sampling clock signal SCLK) are inputted to the second NAND gate 204, such that the second path control signal PS2 in the "1" state is generated at the output of the second NAND gate 204. Further, if the address signal A0 is inputted in the "0" state and the sampling clock signal SCLK is transitioned from the "1" state to the "0" state, the address signal A0 and the the sampling clock signal SCLK are inputted to the first NAND gate 202, such that the first path control signal PS1 in the "1" state is generated at the output of the first NAND gate 202; and the inverted signal/A0 of the address signal and the inverted signal/SCLK of the sampling clock signal are inputted to the second NAND gate 204, such that the second path control signal PS2 in the "0" state is generated at the output of the second NAND gate 204.

As shown in FIG. 5, the path control circuit 300 includes first, second, third, and fourth clocked inverters 302, 304, 306, and 308 respectively, and first and second latches 310 and 320. The first and second clocked inverters 302 and 304 comprise a first multiplexer (into Path 1) for multiplexing a first sampled data SD1 and a second sampled data SD2 into a latch 310 in Path 1. The third and fourth clocked inverters 306 and 308 comprise a second multiplexer (into Path 2) for multiplexing a first sampled data SD1 and a second sampled data SD2 into a latch 320 in Path 2. The first and second multiplexers are activated and controlled by path control signals PS1 and PS2 (and their complements/PS1 and /PS2). When activated, the first multiplexer links and transfers a selected one of the sampled data (SD1 or SD2) into the latch (310) in the first path (Path 1). When activated, the second multiplexer links and transfers the other one of the sampled data (SD2 or SD1) into the latch (320) in the second path (Path 2).

Each of the first and third clocked inverters (302 and 306 respectively) are configured for receiving first data SD1 as an input signal and use the first path control signal PS1 (and its complement/PS1) as a clock signal. Each of the second and fourth clocked inverters 304 and 308 are for receiving second data SD2 as an input signal and use the second path control signal PS2 (and its complement/PS2) as a clock signal. A first latch 310, for storing an output from either one of the first and second clocked inverters 302 and 304 in a latched form (and for inverting the latched output received from either one of the first and second clocked inverters 302 and 304), outputs a first data D1. A second latch 320, for storing an output from either one of the third and fourth clocked inverters 306 and 308 in a latched form (and for inverting the output received from either one of the third and fourth clocked inverters 306 and 308) outputs a second data D2. For example, if the first path control signal PS1 in the "0" state and the second path control signal PS2 in the "1" state are generated (from the path control signal generating circuit 200 of FIG. 4), the first inverted path control signal/PS1 in the "1" state is applied to the first and third clocked inverters 302 and 306, and the first clocked inverter 302 inverts and outputs the first data SD1 and the first latch 310 inverts the output (/SD1) received from the first clocked inverter 302, so that the first data SD1 is sampled and buffered (uninverted) and passed onto the first path Path1 as first data D1. And, the third clocked inverter 306 inverts the second data SD2, and the second latch 320 inverts and outputs the output (/SD2) received from the third clocked inverter 306, so that the second data SD2 is sampled and buffered (uninverted) and passed onto the second path Path2 as second data D2.

Further, if the first path control signal PS1 in the "1" state and the second path control signal PS2 in the "0" state are generated (from the path control signal generating circuit 200 of FIG. 4), the second inverted path control signal/PS2 in the "1" state is applied to the second and fourth clocked inverters 304 and 308, and the second clocked inverter 304 inverts the second data SD2, and the first latch 310 inverts the output (/SD2) from the second clocked inverter 304, enabling the second data SD2 to be sampled and buffered (uninverted) and passed onto the first path Path1 as first data D1. And, the fourth clocked inverter 308 inverts the first data SD1, and the second latch 320 inverts the output (/SD1) from the fourth clocked inverter 308, so that the first sampled data SD1 is sampled and buffered (uninverted) and passed onto the second path Path2 as second data D2.

As shown in FIG. 6, the write control circuit 400 includes two paths andan inverter 450 for inverting a write clock signal WCLK.

The first path Path 1 includes a first master-slave flip-flop comprising: a first clocked inverter 402 for receiving the first data D1 as an input signal and using an inverted write clock signal NWCLK as a clock signal; a first latch 410 for storing an output (/D1) received from the first clocked inverter 402 in a latched form and inverting the output (/D1) received from the first clocked inverter 402; a second clocked inverter 404 for receiving an output signal (D1) received from the first latch 410 as an input signal (using the write clock signal WCLK as a clock signal; and a second latch 420 for storing an output (/D1) received from the second clocked inverter 404 in a latched form and inverting the output (/D1) received from the second clocked inverter as DIN1.

Further, second path Path 2 of write control circuit 400 includes a second Master-Slave flip-flop comprising: a third clocked inverter 406 for receiving a second data D2 as an input signal and an inverted write clock signal/WCLK as a clock signal; a third latch 430 for storing an output (/D2) from the third clocked inverter 406 in a latched form and inverting the output (/D2) received from the third clocked inverter 406; a fourth clocked inverter 408 for receiving an output signal (D2) from the third latch as an input signal and using the write clock signal WCLK as a clock signal; and a fourth latch 440 for storing an output (/D2) received from the fourth clocked inverter 408 in a latched form and inverting the output (/D2) received from the fourth clocked inverter 408 as DIN2. When receiving the write clock signal WCLK (generated in synchronization with the rising edge of the external clock signal), the write control circuit 400 writes the first and second data D1 and D2 to the memory cell along each of their respective paths (Path 1 and Path 2).

Figure 7:
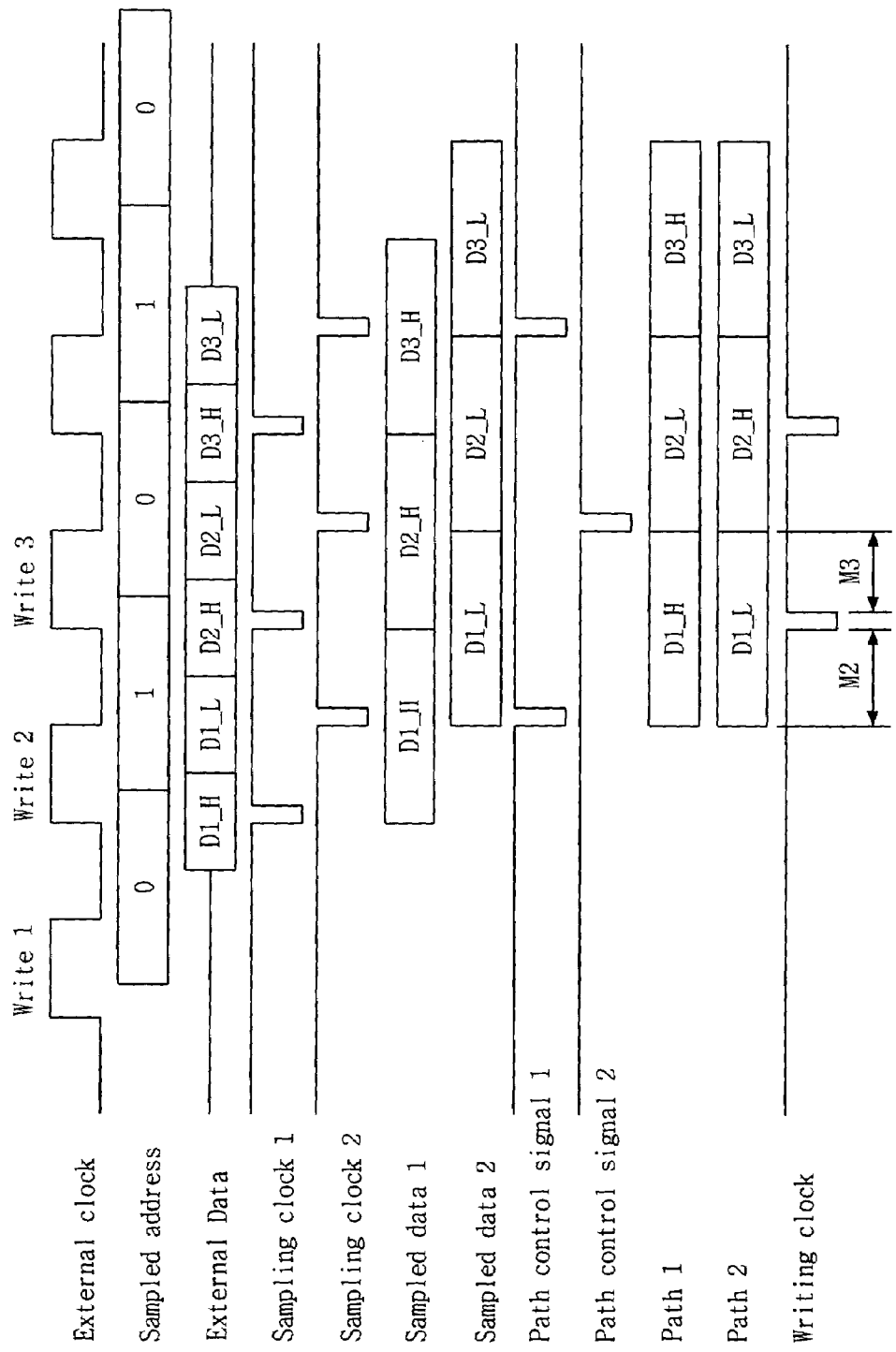
FIG. 7 is a timing diagram showing a data sampling operation in a CC mode of a DDR SRAM device according to an embodiment of the present invention.

FIG. 7 is a timing diagram showing a data sampling operation in a CC mode of a DDR SRAM device according to an embodiment of the present invention. A method for sampling data according to an embodiment of the present invention will be described with reference to FIG. 7.

Referring to FIG. 7, in the CC mode of the DDR SRAM device according to an embodiment of the present invention, four of first to fourth data D1_H, D1_L, D2_H and D2_L are successively inputted in synchronization with the rising or falling edge of the external clock signal ECLK and in response to a write command. The external clock signal ECLK represents a clock signal having a duty cycle of 40% to 60%. A first sampling clock signal SCLK1 is generated in synchronization with a (first) rising edge (transition) of the external clock signal ECLK), so that the first data D1_H is sampled. Next, a second sampling clock signal SCLK2 is generated in synchronization with a (first) falling edge of the external clock signal ECLK, so that the second data D1_L is sampled. Further, a first path control signal PS1 is generated in synchronization with the (first) falling edge of the external clock signal ECLK, so that the first data D1_H is sampled onto the first path (Path1) and the second data D1_L is sampled onto the second path (Path2). The first path control signal (PS1, Path control signal 1) causes the first data D1_H to be linked to the first path (Path1) and the second data D1_L linked to the second path (Path2) when the address signal is in the "1" state.

Subsequently, the first sampling clock SCLK1 is generated in synchronization with a (second) rising edge of the external clock signal, so that the third data D2_H is sampled. Further, a write clock signal WCLK is generated in synchronization with the (second) rising edge of the external clock signal, so that the first data D1_H on the first path and the second data D1_L on the second path are written to the memory cell. Next, a second sampling clock signal SCLK2 is generated in synchronization with the second falling edge of the external clock signal, so that the fourth data D2_L is sampled. Further, a second path control signal PS2 is generated in synchronization with the second falling edge of the external clock signal, so that the third data D2_H is sampled onto the second path 2 and the fourth data D2_L is sampled onto the first path 1. The second path control signal 2 makes the third data D2_H linked to the second path Path2 and the fourth data D2_L linked to the first path Path1 when the address signal is in the "0" state.

Subsequently, a write clock signal is generated (in synchronization with a (third) rising edge of a the external clock signal, (of the next external clock cycle), so that the fourth data D2_L on the first path and the third data D2_H on the second path are written to the memory cell.

Thus, sufficient setup and hold margins M1 and M2 are secured by specifying a path for the data using the first and second path control signals, which are generated in synchronization with the falling edges of the external clock signal, to enable the write clock signal WCLK to be positioned at the center of the data to be written.

Figure 8:
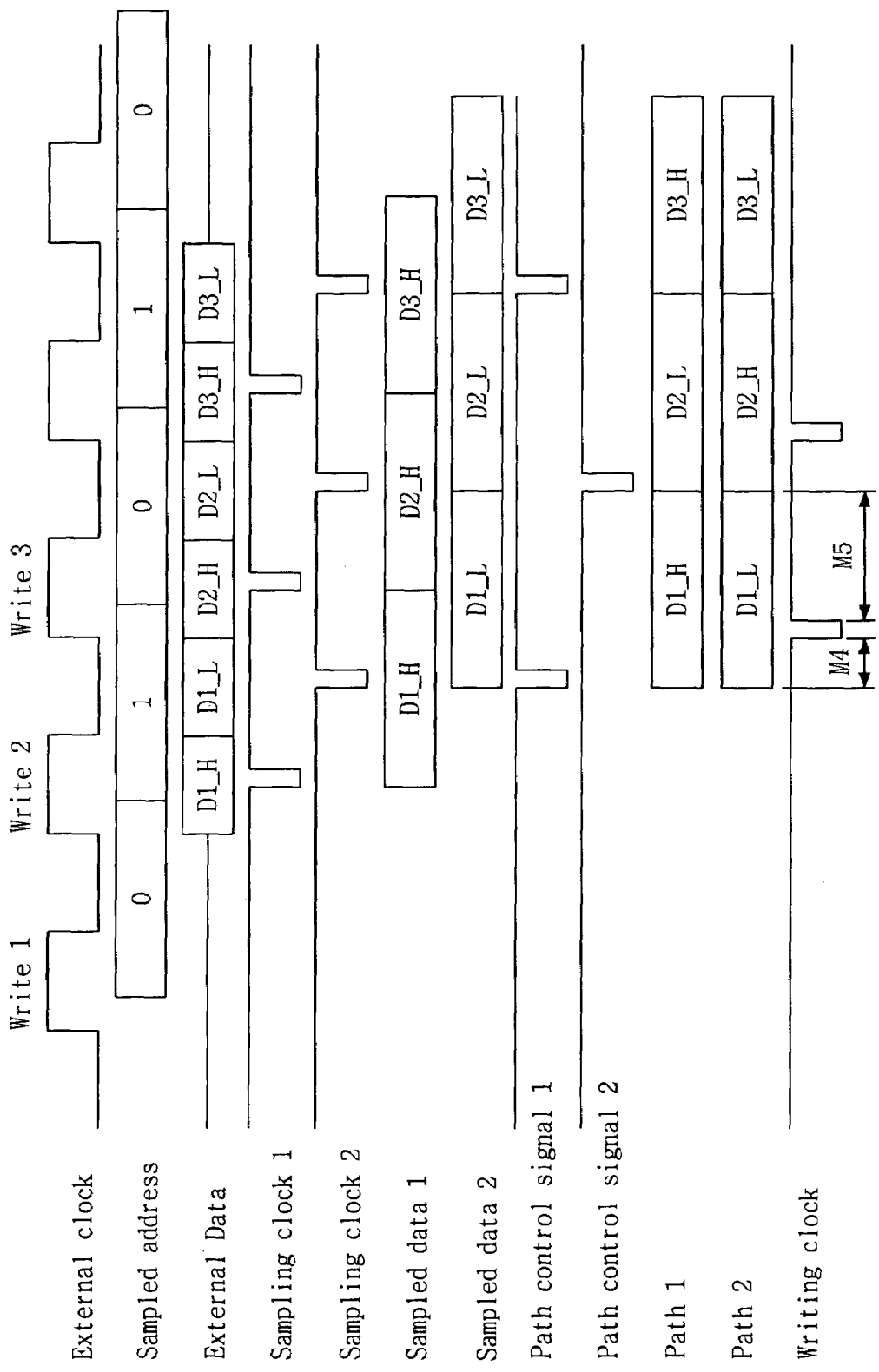
FIG. 8 is a timing diagram showing a data sampling operation in a CA mode of a DDR SRAM device according to an embodiment of the present invention.

FIG. 8 is a timing diagram showing a data sampling operation in a CA mode of a DDR SRAM device according to an embodiment of the present invention. A method for sampling data according to an embodiment of the present invention will be described with reference to FIG. 8.

Referring to FIG. 8, in a CC mode of the DDR SRAM device according to an embodiment of the present invention, four of first to fourth data D1_H, D1_L, D2_H and D2_L are successively inputted in synchronization with a rising or falling edge of the external clock signal ECLK and in response to a write command. The external clock signal ECLK represents a clock signal having a duty cycle of 40% to 60%. A first sampling clock signal SCLK1 is generated in synchronization with a (first) rising edge of the external clock signal, so that the first data D1_H is sampled. Next, a second sampling clock signal SCLK2 is generated in synchronization with a (first) falling edge of the second external clock signal SCLK2, so that the second data D1_L is sampled. Further, a first path control signal PS1 is generated (in synchronization with the (first) falling edge of the external clock signal ECLK), so that the first data D1_H is sampled onto the first path 1 and the second data D1_L is sampled onto the second path 2. The first path control signal (PS1) links the first data D1_H to the first path Path1 and links the second data D1_L to the second path Path2 when the address signal is in the "1" state.

Subsequently, a write clock signal WCLK is generated (in synchronization with the second rising edge of the external clock signal), so that the first data D1_H on the first path and the second data D1_L on the second path are written to the memory cells. Further, a first sampling clock signal (Sampling clock 1) SCLK1 is generated (in synchronization with a second rising edge of the external clock signal), so that the third data D2_H is sampled. Next, a second sampling clock signal (Sampling clock 2) SCLK2 is generated (in synchronization with the second falling edge of the external clock signal), so that the fourth data D2_L is sampled. Further, the second path control signal (Path control signal 2) PS2 is generated (in synchronization with the second falling edge of the external clock signal), so that the third data D2_H is sampled onto the second path 2 and the fourth data D2_L is sampled onto the first path 1. The second path control signal (Path control signal 2) PS2 links the third data D2_H to the second path2 and links the fourth data D2_L to the first path1 when the address signal is in the "0" state.

Subsequently, a write clock signal is generated in synchronization with a rising edge of the external clock signal, (of the next external clock cycle), so that the fourth data D2_L on the first path and the third data D2_H on the second path are written to the memory cell.

As such, a setup margin Ml and a hold margin M2 larger than at least ¼ the external clock cycle is secured. The paths for the data are specified using the path control signal generated in synchronization with the falling edges of the external clock signal, allowing the write clock signal WCLK to be positioned at a ¼ cycle point of the sampled data to be written.

As described above, with the method and a circuit for sampling data according to embodiments of the present invention, it is possible to secure sufficient setup and hold margins irrespective of the operating frequency of a semiconductor memory device having a DDR data sampling scheme, by sampling and linking the data with the first and second path control signals, which are clock signals having different timing (one half-cycle out of phase).

Further, it is possible to secure setup and hold margins having a duration of at least ¼ clock cycle or more in all operation modes, by generating the first and second path control signals (to specify the paths for the data) in synchronization with the falling edge of the external clock signal, allowing the write clock signal WCLK to be positioned at a center or ¼ cycle point of the sampled data to be written.

Further, it is possible to maximize the operation frequency of the semiconductor memory device since internal errors generated upon setup and hold can be reduced or minimized by sampling the data with the path control signal in synchronization with the falling edge of the external clock signal to secure sufficient setup and hold margins in all operation modes.

It will be apparent to those skilled in the art that a method and a circuit for sampling data in a DDR semiconductor memory device according to an embodiment of the present invention is not limited to the exemplary embodiments, and may be variously designed and implemented without departing from the basic principles of the present invention. For example, a data sampling circuit according to the present invention can be designed and applied in various forms so that it is possible to generate the first and second path control signals, (which are clock signals with different timings), in response to the address signal and the sampling clock signal, and to allow the data to be sampled onto the first or second paths in response to the first or second path control signals.

As described above, the present invention has an advantage that in a semiconductor memory device with a DDR data sampling scheme, certain setup and hold margins are secured regardless of the operating frequency, by sampling and linking data with the first and second path control signals as clock signals with different timing.

Further, the present invention has an advantage that setup and hold margins larger than at least ¼ the external clock cycle are secured in all operation modes, (by generating the first and second path control signals in synchronization with the falling edge of the external clock signal to specify a path for the data), enabling a write clock signal WCLK to be positioned at a center or ¼ clock cycle point of the sampled data to be written.

Further, the present invention has an advantage that an operation speed (frequency) of a semiconductor memory device can be maximized since internal errors conventionally generated upon setup and hold can be reduced or minimized by sampling and linking data with a path control signal synchronized with the falling edge of the external clock signal to secure sufficient setup and hold margins in all operation modes.

What is claimed is:

1. A method for sampling data in a double data rate (DDR) memory device including memory cells for storing the data, the method comprising steps of:

sequentially sampling first to fourth data in synchronization with rising edges and falling edges of an external clock signal;

transferring the sampled first data onto a first path and transferring the sampled second data onto a second path in response to a first path control signal;

writing the sampled first data on the first path and the sampled second data on the second path to the memory cells_transferring the sampled third data onto the second path and transferring the sampled fourth data onto the first path in response to a second path control signal; and writing the sampled fourth data on the first path and the sampled third data on the second path to the memory cells.

2. The method according to claim 1, wherein:
the first path control signal is generated in synchronization with a falling edge of the external clock signal; and
the second path control signal is generated in synchronization with a rising edge of the external clock signal.

3. The method according to claim 1, wherein:
the first path control signal is generated in synchronization with a rising edge of the external dock signal; and
the second path control signal is generated in synchronization with a falling edge of the external clock signal.

4. The method according to claim 1, wherein:
writing the sampled first data on the first path and the sampled second data on the second path to the memory cells is performed in response to a first write clock signal; and
writing the sampled fourth data on the first path and the sampled third data on the second path to the memory cell in response to a second write clock signal.

5. The method according to claim 4, wherein:
the first write clock signal is generated in synchronization with a first rising edge of the external clock signal; and
the second write clock signal is generated in synchronization with a second rising edge of the external clock signal.

6. The method according to claim 1, wherein the external clock signal is a clock signal having a duty cycle in the range of 40% to 60%.

7. The method according to claim 1, wherein the first path control signal and second path control signal are each generated in synchronization with falling edges of the external clock signal.

8. The method according to claim 1, wherein the first path control signal transfers the sampled first data onto the first path and transfers the sampled second data onto the second path, if an address signal applied to the memory device is in a "1" state.

9. The method according to claim 1, wherein the second path control signal transfers the sampled third data onto the second path and transfers the sampled fourth data onto the first path when an address signal applied to the memory device is in a "0" state.

10. The method according to claim 1, wherein the method includes a clock centered (CC) mode in which the data is sampled at a center of the external clock signal between adjacent rising and falling edges of the external clock signal.

11. The method according to claim 1, wherein a first write clock signal, for writing the sampled first data on the first path and the sampled second data on the second path to the memory cells, in a dock centered (CC) mode is generated at a center of each of the first and second data that are sampled onto the first path.

12. The method according to claim 1, wherein the method includes a clock aligned (CA) mode in which data is sampled at the rising or falling edge of the external clock signal in synchronization with the rising edge or falling edge of the external clock signal.

13. The method according to claim 1, wherein the write clock signal in a CA mode is generated at approximately the ¼ point of the first to fourth data that are sampled onto the paths.

14. The method according to claim 1, wherein the memory device is a SRAM device.

15. The method according to claim 1, wherein write operation of the first and second data is performed within two external clock signals following the sampling first and second data.

16. The method according to claim 1, wherein setup and hold margins of at least ¼ of the external clock signal's cycle are secured when the write operation of the semiconductor memory device is performed.

17. A method for sampling data in a memory device that includes memory cells for storing the data and uses a double data rate (DDR) sampling scheme, the method comprising steps of:
successively inputting first to fourth data in synchronization with rising and falling edges of a external clock signal;
generating a first sampling clock signal to sample the first data;
generating a second sampling clock signal to sample the second data;
generating a first path control signal to transfer the sampled first data onto a first path and the sampled second data onto a second path; and
generating a write clock signal to write the sampled first data on the first path and the sampled second data on the second path to the memory cells,
generating the first sampling clock signal to sample the third data;
generating the second sampling clock signal to sample the fourth data;
generating a second path control signal to transfer the sampled third data onto the second path and the sampled fourth data onto the first path; and
generating a second write clock signal to write the sampled fourth data on the first path and the sampled third data on the second path to the memory cells.

18. The method according to claim 17, wherein
the first sampling clock signal is in synchronization with rising edges of the external clock signal:
the second samplig clock signal is in synchronization with falling edges of the external clock signal; and
the first and second write clock signals are in synchronization with the rising edges of the external clock signal.

19. A circuit for writing data in a DDR memory device that includes memory cells for storing the data, the circuit comprising:
a path control signal generating circuit for generating first and second path control signals in response to an address signal and a sampling clock signal, the first and second path control signals being clock signals having a half-cycle phase difference;
a path control circuit for transferring sampled first input data onto a first path in response to the first path control signal, and for transferring sampled second input data onto a second path in response to the second path control signal; and
a write control circuit for writing the samoled input data to the memory cells in response to a write clock signal.
wherein each of the first and second path control signals are generated in synchronization with a falling edge of the external clock signal.

20. The circuit according to claim 19, wherein the sampled input data are sampled in synchronization with the rising and falling edges of an external clock signal.

21. The circuit according to claim 19, wherein a first sampling clock signal for sampling a first input data is generated in synchronization with the rising edge of an external clock signal and a second sampling clock signal for sampling a second input data is generated in synchronization with the falling edge of the external clock signal.

22. The circuit according to claim 19, wherein a first sampling clock signal for sampling a first input data is generated in synchronization with the falling edge of an external clock signal and a second sampling clock signal for sampling a second input data is generated in synchronization with the rising edge of the external clock signal.

23. A circuit for writing data in a DDR memory device that includes memory cells for storing the data, the circuit comprising:
  a path control signal generating circuit for generating first and second path control signals in response to an address signal and a sampling clock signal the first and second path control signals being clock signals having a half code phase difference;
  a path control circuit for transferring sampled first input data onto a first path in response to the first path control signal and for transferring sampled second input data onto a second path in response to the second path control signal; and
  a write control circuit for writing the sampled input data to the memory cells in response to a write clock signal.
  wherein the write clock signal is generated in synchronization with a rising edge of the external clock signal.

24. The circuit according to claim 23, wherein the memory device is a SRAM device.

25. The circuit according to claim 23, wherein the write operation of first and second input data to the memory cells is performed within two periods of an external clock signal after the first input data has been sampled.

26. The circuit according to claim 25, wherein the write operation of first and second input data to the memory cells is performed within one period of an external clock signal after the first input data has been sampled.

27. A circuit for writing data into memory cells in a double data rate (DDR) memory device, the circuit comprising:
  a first multiplexer for selecting and transferring a sampled first input data into a first path, in response to an activated first path control signal, and for selecting and transferring a sampled second input data into the first path, in response to an activated second path control signal;
  a second multiplexer for selecting and transferring the sampled second input data into a second path, in response to the activated first path control signal and for selecting and transferring the sampled first input data into the second path, in response to the activated second path control signal; and
  a path control signal generating circuit for alternately activating first and second path control signals in response to an address signal and a first sampling clock signal.

28. The circuit of claim 27, wherein
  the first path includes a first master-slave flip-flop for writing the selected sampled input data to a first memory cell in response to a write clock pulse; and
  the second path includes a second master-slave flip-flop for writing the selected sampled input data to a second memory cell in response to a pulse of a write clock signal.

29. The circuit of claim 27, wherein the first path control signal is the logical complement of the second path control signal while either one of the first and second path control signals are active.

30. The circuit of claim 27, further comprising:
  a write control circuit for writing the sampled input data to the memory cells in response to a write clock signal.

31. A circuit for writing data into memory cells in a double data rate (DDR) memory device, the circuit comprising:
  a first multiplexer for selecting and transferring a sampled first input data into a first path, in response to an activated first path control signal, and for selecting and transferring a sampled second input data into the first path, in response to an activated second path control signal;
  a second multiplexer for selecting and transferring the sampled second input data into a second path, in response to the activated first path control signal, and for selecting and transferring the sampled first input data into the second path, in response to the activated second path control signal; and
  a write control circuit for writing the sampled input data to the memory cells in response to a write clock signal,
  wherein the write control circuit includes;
  a first master-slave flip-flop for writing the selected sampled input data in the first path to a first memory cell in response to the write clock signal; and
  a second master-slave flip-flop for writing the selected sampled input data in the second path to a second memory cell in response to the write clock signal.

* * * * *